(12) United States Patent
Horibe

(10) Patent No.: US 7,138,725 B2
(45) Date of Patent: Nov. 21, 2006

(54) SEMICONDUCTOR DEVICE

(75) Inventor: Hiroshi Horibe, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 155 days.

(21) Appl. No.: 10/954,181

(22) Filed: Oct. 1, 2004

(65) Prior Publication Data

US 2005/0082659 A1    Apr. 21, 2005

(30) Foreign Application Priority Data

Oct. 1, 2003    (JP) .............................. 2003-343348

(51) Int. Cl.
*H01L 23/48*     (2006.01)
*H01L 23/485*    (2006.01)

(52) U.S. Cl. ...................... 257/786; 257/780; 257/782; 257/784; 257/666

(58) Field of Classification Search ................ 257/666, 257/780–782, 784, 693
See application file for complete search history.

(56) References Cited

U.S. PATENT DOCUMENTS 6,258,624 B1 * 7/2001 Corisis ........................ 438/106

6,614,101 B1   9/2003 Misumi et al.
6,720,666 B1 * 4/2004 Lim et al. .................... 257/786

FOREIGN PATENT DOCUMENTS

| JP | 10-242373 | 9/1998 |
|---|---|---|
| JP | 2001-156107 | 6/2001 |
| JP | 2001-156237 | 6/2001 |

* cited by examiner

*Primary Examiner*—Jasmine Clark
(74) *Attorney, Agent, or Firm*—McDermott Will & Emery LLP

(57) ABSTRACT

In order to provide a downsized semiconductor device increased in function level with output terminals arranged along at least three sides of a semiconductor chip, the semiconductor device includes a semiconductor chip having a row of aggregated pads arranged on a main surface, and a row of output terminals arranged along at least three sides at a perimeter of the semiconductor chip, wire-bonded with the row of aggregated pads.

5 Claims, 7 Drawing Sheets

$s \geq \frac{1}{2} S$ $d \leqq \frac{1}{4} L$

SEMICONDUCTOR DEVICE

BACKGROUND OF THE INVENTION

1. Field of the Invention

The present invention relates to a semiconductor device having wires attached to a semiconductor chip, and encapsulated with resin.

2. Description of the Background Art

As to packages having output terminals arranged in four directions along the four sides of a rectangle such as a QFP (Quad Flat Package) and BGA (Ball Grid Array), the bonding pads on a semiconductor chip are arranged along the edge of the four sides of a rectangle. By such a structure, electrical connection can be established through wire bonding between an output terminal and a bonding pad on a semiconductor chip without crossing of wires (fine metal wires).

The structure having bonding pads arranged along the four sides is disadvantageous in that the dead space between the bonding pads and the like cannot be obviated. It was difficult to reduce the chip size. In the above-described structure, fine wires must be routed from an active part in the chip to a region in the periphery of the chip (bonding pad site), causing the problem of signal delay, noise, and the like. A burden is laid on the chip designer to avoid such problems. In order to establish wiring up to a bonding pad in the above-described structure, the active part must be divided or reallocated. Therefore, redesigning of a chip is required when a new device is to be developed even though there is a chip that can serve as the base. The load on the task in chip designing was significantly increased.

In view of the foregoing, there are proposed a semiconductor device having electrode pads on a semiconductor chip aggregated along one side (refer to Japanese Patent Laying-Open No. 2001-156107), a semiconductor device employing an LOC (Lead Over Chip) structure in which electrode pads are arranged in an H shape on a semiconductor chip with lead terminals at the longer side placed on a semiconductor chip region (refer to Japanese Patent Laying-Open No. 10-242373), and a semiconductor device having the lead and chip provided at different heights with a row of electrode pads aggregated at the center of the semiconductor chip (refer to Japanese Patent Laying-Open No. 2001-156237), and the like.

The number of electrode pads and the number of inner leads must be increased when there are more electrical signals to be transferred at one reflecting the increase in the degree of integration of semiconductor devices. There is a limit in reducing the size of a semiconductor device in which the number of sides where inner leads can be arranged is restricted as set forth above. If more inner leads are arranged along the limited sides in accordance with the increase of electrode pads and inner leads, each inner lead will become so small that defects such as inner lead deformation occurs. It was therefore necessary to set the dimension of the inner lead with a limit in size reduction.

SUMMARY OF THE INVENTION

In view of the foregoing, an object of the present invention is to provide a downsized semiconductor device that suppresses signal delay and noise, and allows a new device to be developed efficiently.

A semiconductor device according to an aspect of the present invention includes a semiconductor chip having a row of aggregated pads arranged on a main surface, and a row of output terminals arranged along at least three sides at the perimeter of the semiconductor chip, wire-bonded with the row of aggregated pads.

By virtue of the structure, dead space can be suppressed to allow reduction in size. Furthermore, the problem of signal delay and noise can be eliminated since it is not necessary to route fine wires on the chip. It is also no longer necessary to divide or reallocate the active portion, allowing a new device is to be developed efficiently in accordance with a chip serving as the base. As used herein, a row of aggregated pads refers to those satisfying the following conditions A1, A2 and A3:

A1: there are no other row of pads that is arranged parallel to the row of aggregated pads;

A2: the row of aggregated pads is arranged linearly, or arranged in two linear rows apart at a distance of not more than ¼ the distance between the two opposing sides mentioned above; and A3: the row of aggregated pads is formed along at least ½ of each length of the opposing sides.

The semiconductor device of the present invention is reduced in size to have output terminals arranged along at least three sides outside the semiconductor chip, suppressed in signal delay and noise by the row of aggregated pads. A new device can be developed economically, rapidly, and stably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
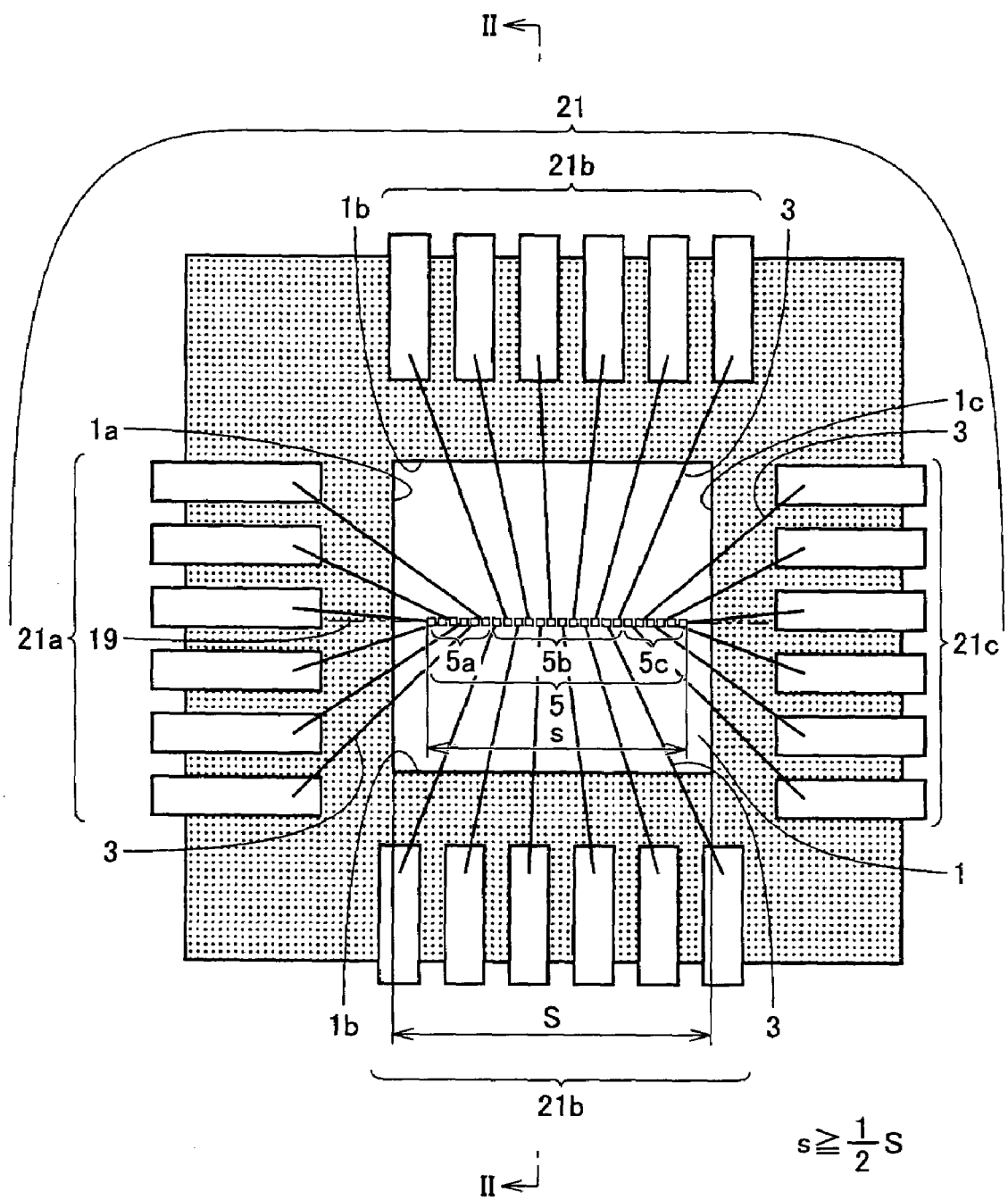
FIG. 1 represent a semiconductor device according to a first embodiment of the present invention.
Figure 2:
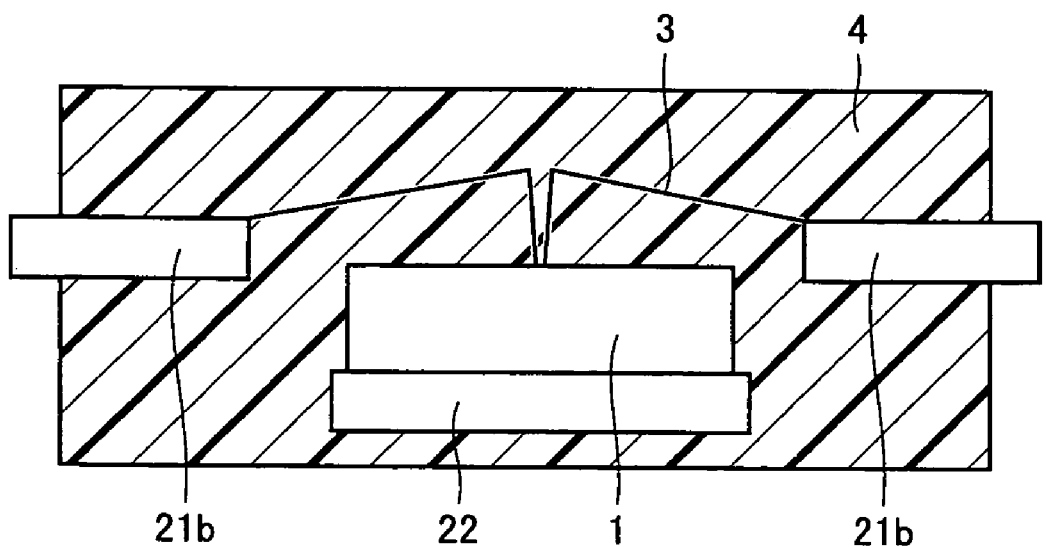
FIG. 2 is a sectional view of the semiconductor device of FIG. 1 taken along line II—II.

FIGS. 1 and 2 correspond to a semiconductor device according to a first embodiment of the present invention.

Referring to FIGS. 1 and 2, a semiconductor chip 1 mounted on a die pad 22 has one row of bonding pads 5 arranged along a pad line 19. These bonding pads 5 are a row of aggregated pads aligned between and parallel to two opposite sides 1b of semiconductor chip 1 in an intensive manner with no other row of pads aligned parallel to the two sides 1b. In other words, bonding pad row 5 satisfies the above-described conditions of A1, A2 and A3 for aggregated pads. In FIG. 1, condition A3 is represented as $s \geq (\frac{1}{2})$ S.

Sides 1a and 1c of semiconductor chip 1 correspond to sides that cross pad line 19 on which the row of aggregated pads is aligned. Inner leads 21 identified as output terminals are arranged surrounding semiconductor chip 1, corresponding to respective sides of the rectangular semiconductor chip from the outer side. When viewed in plane, the semiconductor device of FIG. 1 includes four rows of output terminals 21a, 21b, and 21c corresponding to a relevant side of the four sides of semiconductor chip 1. There are two rows of output terminals 21b arranged corresponding to the two opposite sides 1b of semiconductor chip 1. Output terminal rows 21a and 21c are arranged along and corresponding to sides 1a and 1c, respectively.

As shown in FIG. 2, inner leads 21a, 21b and 21c are provided at a location higher than the surface of semiconductor chip 1. Inner leads 21a, 21b and 21c are connected to relevant bonding pads 5 of semiconductor chip 1 through fine metal wires 3. The root region of semiconductor chip 1, die pad 22, fine metal wires 3 and inner leads 21 are encapsulated in sealing resin 4. Inner lead 21 has its leading end protruding from sealing resin 4.

Fine metal wire 3 is formed of a base of Cu or Fe plated with Ag or the like on its surface. Bonding pads 5 is divided into bonding pads 5a and 5c of either side regions, and bonding pads 5b of the middle region. A bonding pad of either side region, for example, a bonding pad 5a of the left side region is connected via fine metal wire 3 to an appropriate one of inner leads 21a positioned along side 1a located in the proximity of bonding pad 5a. Bonding pad 5b of the middle region is connected via fine metal wire 3 to an appropriate one of inner leads 21b corresponding to the upper and lower sides 1b in FIG. 1. Respective ones of inner leads 21b corresponding to upper side 1b and lower side 1b are alternately connected to bonding pads 5b aligned linearly in a dot-sequential manner such that adjacent bonding pads 5b of the middle region are alternately connected to respective upper and lower inner leads 21b. Inner leads 21c corresponding to right side 1c are respectively connected to bonding pads 5c via fine metal wire 3.

Arranging inner leads along at least three sides is advantageous in that high-speed operation can be realized by the increased number of electric signals that can be transferred simultaneously as a result of the provision of more inner leads laid out (terminals for connection). If the number of inner leads is increased along sides that are restricted to two or one side as in the conventional case, each inner lead must be made smaller to cause deformation of inner leads as well as short-circuiting when the semiconductor device is attached to the substrate. This will increase the generation of defects. The size of the semiconductor device had to be increased in order to ensure sufficient inner lead size to avoid such problems.

Figure 3:
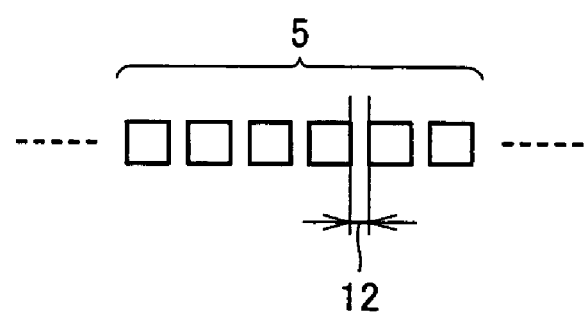
FIG. 3 shows the dead space between bonding pads of FIG. 1.

By the location of the surface of inner lead 21 arranged upper than the surface of semiconductor chip 1 in the configuration set forth above, the possibility of short-circuiting between the edge of semiconductor chip 1 and fine metal wire 3 can be eliminated. Accordingly, fine metal wire 3 can be set lower. As a result, the flow of fine metal wire 3 during resin-sealing can be controlled readily. As shown in FIG. 3, the dead space 12 between bonding pads 5 on semiconductor chip can be suppressed to the minimum.

As described above, the row of bonding pads are divided into those of left side region 5a, right side region 5a and middle region 5b, wherein bonding pads in left side region 5a are connected to inner leads 21a corresponding to left side 1a, bonding pads in right side region 5c are connected to inner leads 21c corresponding to right side 1c, and bonding pads in middle region 5b are connected to inner leads 21b corresponding to two opposite sides 1b, all through fine metal wires 3. Such connection by fine metal wires allows the distance (interval) between fine metal wires 3 to be increased. Accordingly, the flow of fine metal wire 3 during resin-sealing can be suppressed readily, and dead space 12 between bonding pads 5 can be reduced. In the above-described case, adjacent pads in the one row of aggregated pads can be arranged in a staggered configuration, alternately shifted to one side and the other side.

Furthermore, bonding pads 5 can be arranged intensively in the middle area of the chip to minimize the dead space in the neighborhood of bonding pad 5. Accordingly, the chip can be reduced in size.

Figure 4:
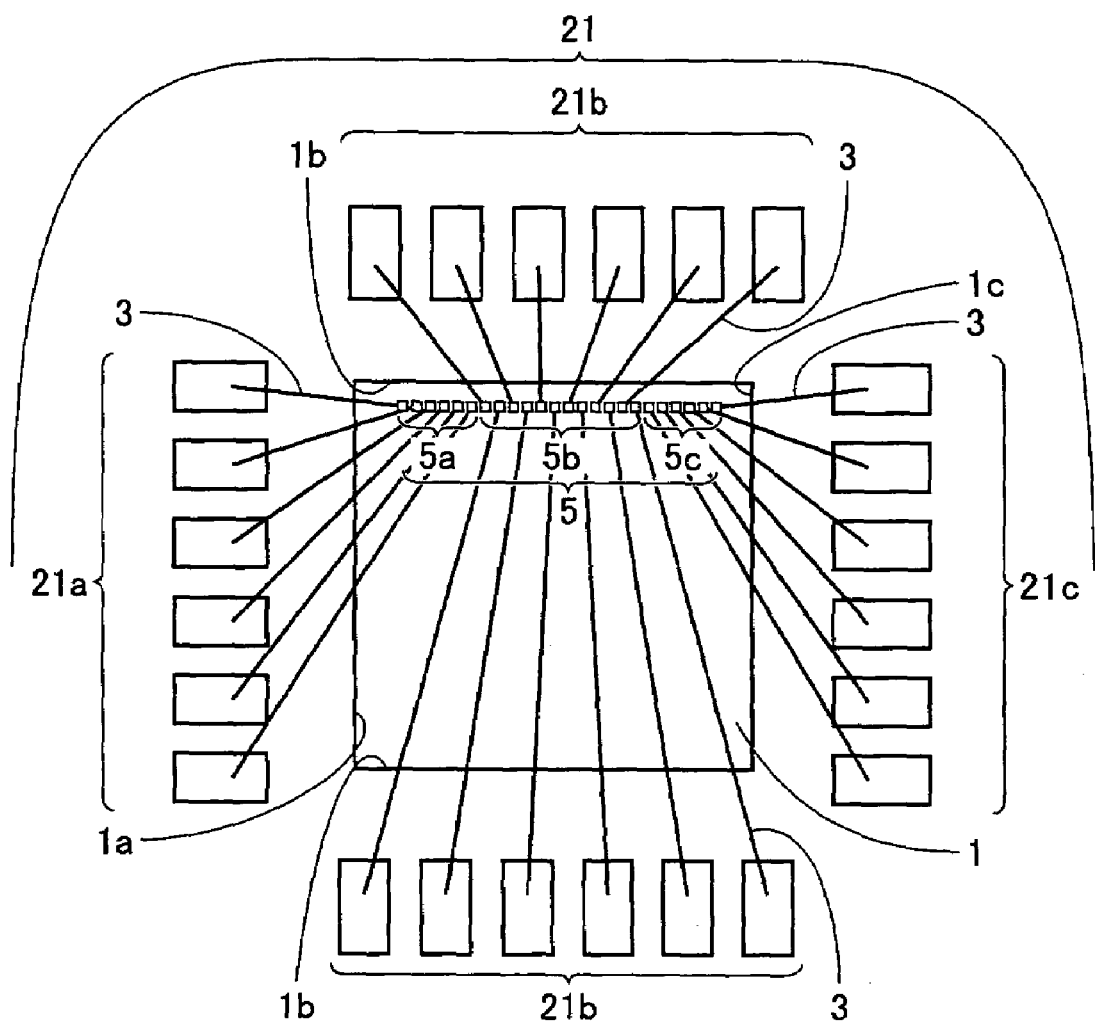
FIG. 4 represents a modification of the semiconductor device of the first embodiment.

Although the above embodiment was described in which bonding pads 5 are aggregated in the neighborhood of the middle area of the chip, bonding pads may also be aggregated along one of the two opposite sides of the chip. FIG. 4 shows such an example, which is a modification of the semiconductor device of FIG. 1. Bonding pads 5 are aggregated along the edge of one of the two opposite sides of semiconductor chip 1.

Figure 5:
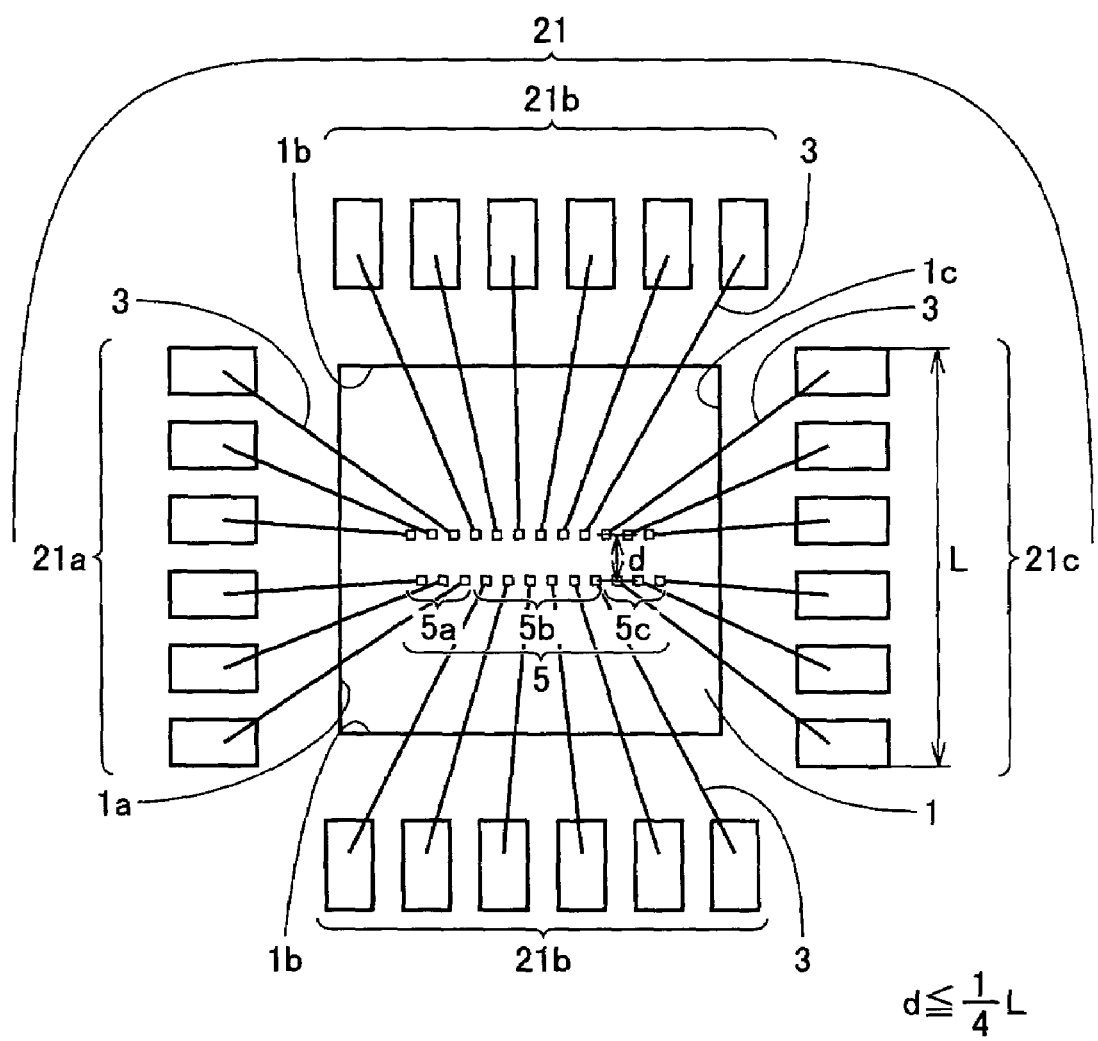
FIG. 5 represents another modification of the semiconductor device of the first embodiment.

As an alternative to one row of bonding pads 5 shown in FIGS. 1 and 4 as the row of aggregated pads, the aggregated pad row may be formed of two rows of pads, as shown in FIG. 5. In this case, the aforementioned condition of A2 must be satisfied. Specifically, distance $d \leq (\frac{1}{4})$ L between the two rows of pads must be satisfied. L represents the distance between the both ends of one row of leads. It is apparent that conditions A1 and A3 are satisfied. One of the two rows of pads can take a staggered configuration with respect to the other row of pads. As described above, adjacent pads in one row of aggregated pads may be arranged in a staggered configuration shifted alternately to one side and the other side.

The advantage of not employing an LOC structure as in the above case is set forth below. In an LOC structure, the chip is fixed, not directly on a die pad, but through attachment to the back side of the inner lead with a resin film. When viewed in an opposite manner, the inner lead is attached on the chip with a soft resin film therebetween. Therefore, fixation of the inner lead when a fine metal wire is to be bonded to the inner lead is insufficient, degrading the bonding stability significantly. Such a problem does not occur in the present invention since fixation of the inner lead is conducted on a firm metal jig where an LOC structure is not employed.

Second Embodiment

Figure 6:
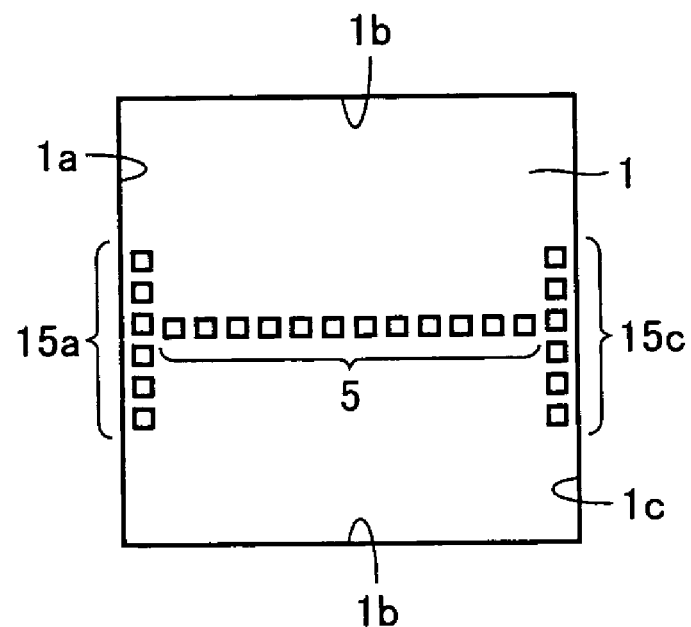
FIG. 6 represents a semiconductor chip in a semiconductor device according to a second embodiment of the present invention.
Figure 7:
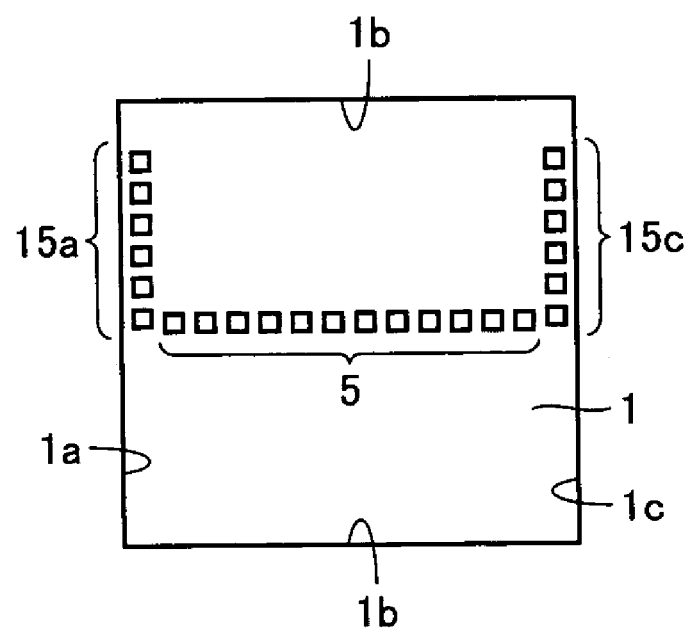
FIG. 7 represents a modification of a semiconductor chip in the semiconductor device of the second embodiment.
Figure 8:
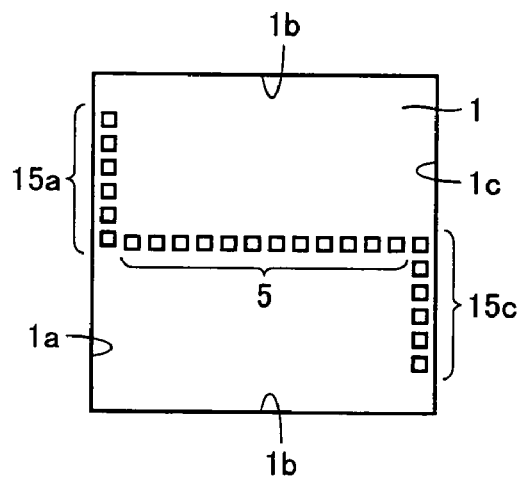
FIG. 8 represents another modification of a semiconductor chip in the semiconductor device of the second embodiment.

FIGS. 6–8 represent a semiconductor chip in a semiconductor device according to a second embodiment of the present invention. In contrast to the previous first embodiment in which the semiconductor chip has only a row of aggregated pads arranged, the semiconductor chip of FIG. 6 has pads arranged in an H shape, when viewed in plane, including a row of aggregated pads 5 and row of pads 15a and 15c. Pad rows 15a and 15c are not rows of aggregated pads since they do not satisfy both the condition of A1 and A2 directed to a row of aggregated pads. Pad rows 15a and 15c are rows of pads located along the edges of sides 1a and 1c. The dead space can be reduced as compared to the conventional arrangement by virtue of the arrangement of pads in an H shape corresponding to the combination of aggregated pad row 5 and pad rows 15a and 15c.

FIG. 7 represents a semiconductor chip having pads form a U shape, when viewed in plane, by aggregated pad rows 5 and pad rows 15a and 15c. FIG. 8 represents a pattern of pads arranged in a crank configuration (two corners linked at their ends so as to be dot-symmetrical).

In respective arrangements of pads of FIGS. 6–8, respective pads of aggregated pad row 5 are connected such that adjacent pads are connected alternately to respective upper and lower inner leads via fine metal wires. Each pad in pad rows 15a and 15c is connected through a fine metal wire to an appropriate one of inner leads corresponding to sides 1a and 1c along which the pads are aligned.

The above embodiments correspond to the case where inner leads are arranged along the four sides. Alternatively, inner leads may be arranged at only three sides.

Third Embodiment

The previous first and second embodiments were described in which inner leads 21 are arranged at substantially the same density along the sides of a semiconductor chip. The present third embodiment is characterized in that the arrangement of the row of inner leads corresponding to sides 1a and 1c that cross pad line 19 along which the pads of aggregated pad row 5 are arranged can be altered.

Figure 9:
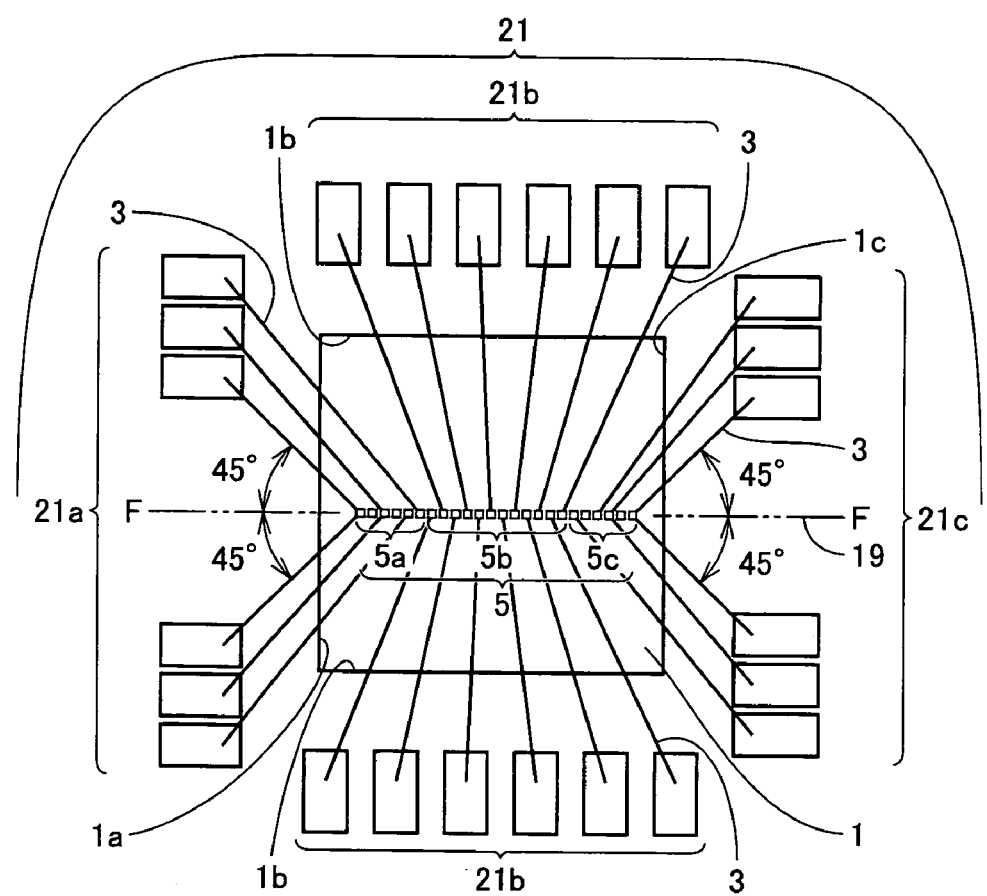
FIG. 9 represents a semiconductor device according to a third embodiment of the present invention.

Referring to FIG. 9, the semiconductor device of the third embodiment does not have inner lead arranged in a region of the total of 90°, including the angle of 45° from pad line 19 to the upper side and an angle of 45° from pad line 19 to the lower side, with the end-most located pad as the vertex. By providing such an "output terminal free zone" F, inner lead rows 21a and 21c are divided into two ranges. By such an arrangement of the inner leads, the fine metal wire coupling a bonding pad and an inner lead can be set to be approximately 45°, when viewed in plane (FIG. 9).

The above-described arrangement of inner leads allows sufficient intervals between fine metal wires connecting an inner lead corresponding to a side that crosses the line of pads and bonding pads. Contact between fine metal wires can be avoided with margin.

Figure 10:
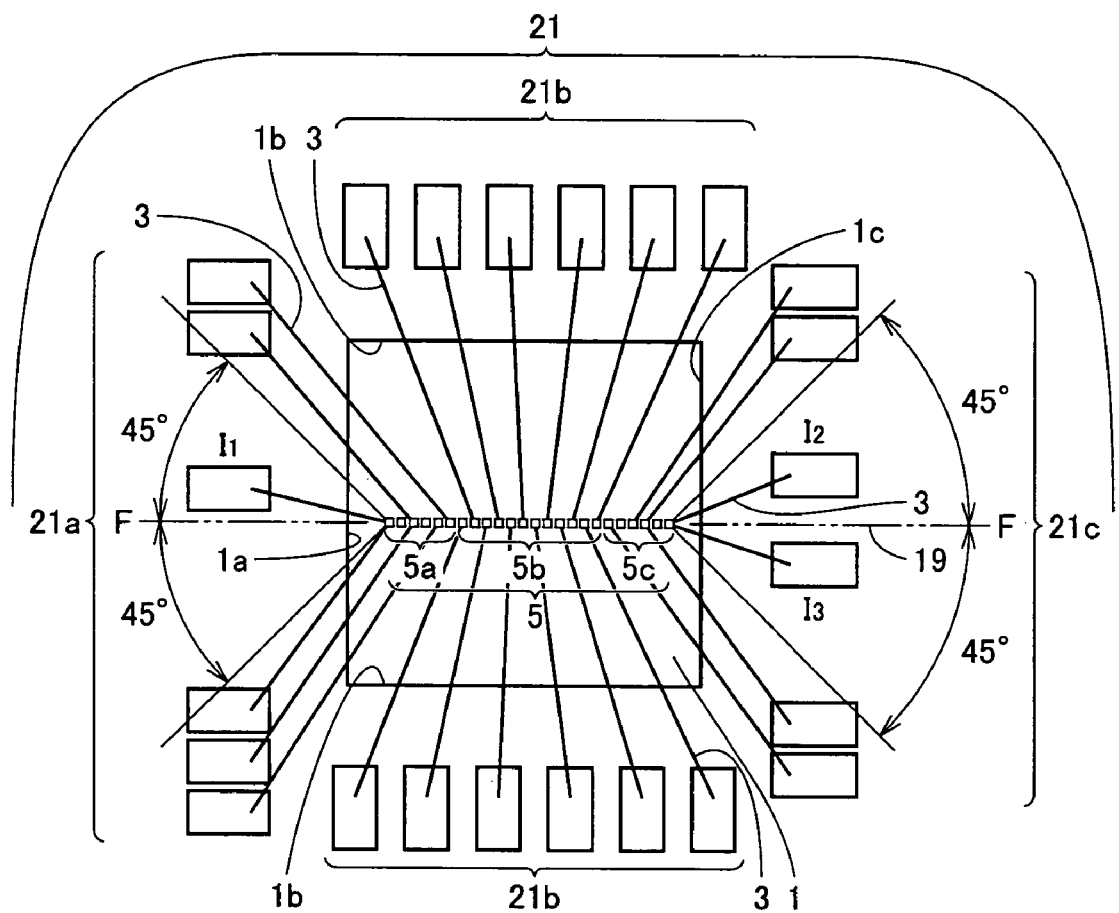
FIG. 10 represents a modification of the semiconductor device of the third embodiment.

FIG. 9 corresponds to a configuration in which no inner lead is disposed in the output terminal-free zone. Alternatively, one or two inner leads can be arranged in the output terminal free zone, as shown in FIG. 10. In view of the provision of one or two inner leads, the "output terminal free zone" is preferably defined as "a region in a range of the total of 90° including the angle of 45° from the pad line passing through the row of aggregated pads to the upper side and the angle of 45° from the same pad line to the lower side, with the pad located at the end of the row of aggregated pads as the vertex", to be more consistent with the actual meaning of the designation. The range set forth above may be referred to as the output terminal free zone even in the case where two inner leads at the most are disposed.

Fourth Embodiment

Figure 11:
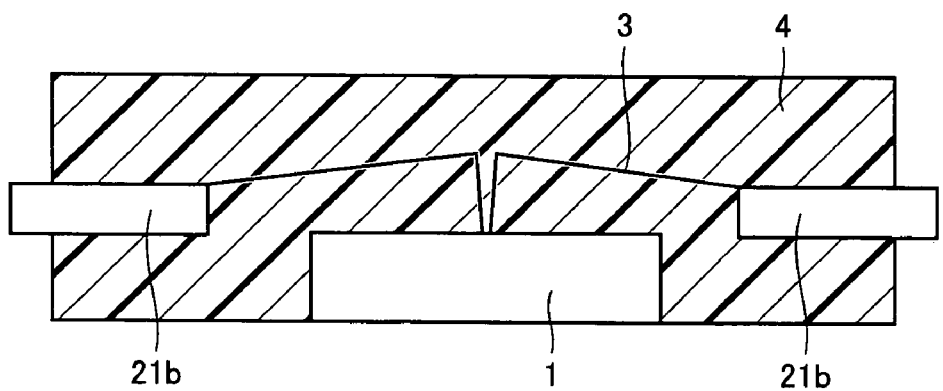
FIG. 11 represents a semiconductor device according to a fourth embodiment of the present invention.

In contrast to the previous semiconductor device of FIG. 2 having the semiconductor chip mounted on a die pad with the back side also covered with sealing resin, the semiconductor chip may have its back side exposed at the sealing resin, as shown in FIG. 11 of the fourth embodiment. Furthermore, the semiconductor chip may be or not be mounted on a die pad. In the case where the semiconductor chip is mounted on a die pad, the back side of the die pad will be exposed at the sealing resin. This is included in the scope of the present invention.

Fifth Embodiment

The above embodiments were described based on a metal frame used in QFP and the like. In the present fifth embodiment, the frame can be a resin frame employed in FBGA (Flexible Ball Grid Array) and the like. Usage of a resin frame provides the advantage of reducing the weight and farther reducing the size, in addition to the advantages set forth above for the previous embodiments.

Other embodiments of the present invention will be described briefly hereinafter, including the previous embodiments of the present invention.

A row of aggregated pads can be arranged at the middle area of two opposite sides. By this arrangement, connection between output terminals corresponding to the opposite sides and bonding pads located at the middle area can be achieved with symmetry, in addition to suppressing dead space.

The row of aggregated pads can be arranged along the edge of one side of the two opposite sides of the semiconductor chip. This configuration allows various patterns of pads to be employed in accordance with the configuration of the semiconductor chip while suppressing dead space and allowing a new device to be developed efficiently in accordance with the chip serving as the base. In a general circuit layout in a chip, it is efficient to arrange functional blocks in combination. Restriction in pad positioning in a chip will increase the task of dividing and/or reallocating the blocks, requiring confirmation of variation in electrical characteristics and feedback according to the division and/or reallocation. As such, layout efficiency will be degraded significantly. The above-described arrangement of a row of aggregated pads of the present invention provides one pattern of a variety of pads.

The row of aggregated pads can be formed of pads arranged so as to correspond to two straight lines arranged between two opposite sides at a distance not more than ¼ the distance between these two opposite sides.

An advantage similar to that of one row of aggregated pads can be achieved by such a structure. The configuration of two rows further facilitates connection of fine metal wires during wire bonding.

In addition to a row of aggregated pads, a row of pads arranged along the edge of a side crossing the direction along which the row of aggregated pads are aligned can be provided. For example, a pad pattern of an H shape, a U shape, or a crank shape, when viewed in plane, formed of a row of aggregated pads and a row of pads, may be provided.

By such a combination of a row of aggregated pads and a normal row of pads, inner leads corresponding to at least three sides at the perimeter of a semiconductor chip can be connected while reducing the possibility of short-circuiting between fine metal wires.

Respective terminals of a first row of output terminals corresponding to one of two opposite sides and respective terminals of a second row of output terminals corresponding to the other side of the two opposite sides can be alternately connected to the pads in a row of aggregated pads via fine metal wires.

By such a structure, the possibility of short-circuiting between fine metal wires can be eliminated while suppressing dead space.

An output terminal free zone can be provided in which output terminals are not arranged in a region in a range of the total of 90° including an angle of 45° from a pad line through which a row of aggregated pads pass to one side and an angle of 45° from the same pad line to the other side, with the pad located at an end of the row of aggregated pads as the vertex. The straight line corresponding to the fine metal line connection coupling respective terminals in the row of output terminals arranged along a side with respective pads in the row of aggregated pads can be set to be angled at approximately 45°, when viewed in plane, with respect to the line of pads where the row of aggregated pads pass through. Further, one or two output terminals may be disposed at a region in a range of the total of 90° including the angle of 45° from the pad line through which the row of aggregated pads pass to one side and the angle of 45° from the same pad line to the other side, with the pad located at an end of the row of aggregated pads as the vertex.

By such a structure, sufficient spacing can be provided between fine metal wires connecting an output terminal arranged corresponding to a side with a bonding pad. Thus, short-circuiting between fine metal wires can be prevented.

The height of the top surface of the semiconductor chip can be set equal to or lower than the top face of the terminals of the row of output terminals.

By such a configuration, the possibility of short-circuiting between the edge of the semiconductor chip and a fine metal wire is eliminated. The height of the fine metal wire can be set lower. Therefore, the flow of fine metal wires during resin sealing can be suppressed. As a result, the dead space between bonding pads can be reduced.

The semiconductor device can be encapsulated with resin, and the back side of the semiconductor chip may be exposed at the sealing resin. Furthermore, the semiconductor device can be encapsulated with resin, and the die pad arranged at the back side of the semiconductor chip may be exposed at the sealing resin.

By such a configuration, the semiconductor device can be made thinner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor chip including a row of aggregated pads arranged on a main surface, and a row of output terminals arranged along at least three sides at a perimeter of said semiconductor chip, and wire-bonded with said row of aggregated pads;
   wherein said row of aggregated pads is positioned at a middle area of two opposing sides of said semiconductor chip, and
   wherein said row of aggregated pads is fonned of two linear rows of pads arranged at a distance of not more than ¼ of the distance between said two opposing sides.

2. A semiconductor device comprising:
   a semiconductor chip including a row of aggregated pads arranged on a main surface, and a row of output terminals arranged along at least three sides at a perimeter of said semiconductor chip, and wire-bonded with said row of aggregated pads;
   wherein said row of aggregated pads is arranged at a margin of one side of said two opposite sides, and
   wherein said row of aggregated pads is formed of two linear rows of pads arranged at a distance of not more than ¼ of the distance between said two opposing sides.

3. A semiconductor device comprising:
   a semiconductor chip including a row of aggregated pads arranged on a main surface, and a row of output terminals arranged along at least three sides at a perimeter of said semiconductor chip, and wire-bonded with said row of aggregated pads;
   wherein an output terminal free zone is provided, said output terminal free zone absent of a disposition of an output terminal from a region in a range of a total of 90.degree. including an angle of 45.degree. from a line of pads through which said row of aggregated pads pass to one side and an angle of 45.degree. from the same line of pads to the other side, with a pad located at an end of said row of aggregated pads as a vertex.

4. The semiconductor device according to claim 3, wherein a straight line corresponding to a connection of said fine metal line coupling a terminal in said row of output terminals arranged along said crossing side with a pad in said row of aggregated pads is angled approximately 45.degree., when viewed in plane, with respect to the line of pads where the row of aggregated pads pass.

5. A semiconductor device comprising:
   a semiconductor chip including a row of aggregated pads arranged on a main surface, and a row of output terminals arranged along at least three sides at a perimeter of said semiconductor chip, and wire-bonded with said row of aggregated pads;
   wherein not more than two output terminals are arranged in a region in a range of a total of 90.degree. including an angle of 45.degree. from a line of pads through which said row of aggregated pads pass to one side and an angle of 45.degree. from the same line of pads to the other side, with a pad located at an end of said row of aggregated pads as a vertex.

* * * * *